(12) United States Patent
Lovett

(10) Patent No.: US 7,408,813 B2
(45) Date of Patent: Aug. 5, 2008

(54) BLOCK ERASE FOR VOLATILE MEMORY

(75) Inventor: Simon J. Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 11/499,622

(22) Filed: Aug. 3, 2006

(65) Prior Publication Data

US 2008/0031067 A1 Feb. 7, 2008

(51) Int. Cl.
*G11C 11/34* (2006.01)
*G11C 7/00* (2006.01)

(52) U.S. Cl. .......................... 365/185.29; 365/185.11; 365/222; 365/190; 365/205; 365/207; 365/208

(58) Field of Classification Search ................. 365/190, 365/205, 207, 208, 222, 230.03, 185.08, 365/185.11, 185.29
See application file for complete search history.

(56) References Cited

U.S. PATENT DOCUMENTS

| | | | | |
|---|---|---|---|---|
| 4,161,040 A * | 7/1979 | Satoh | .......................... | 365/190 |
| 4,897,568 A * | 1/1990 | Chern et al. | ................. | 365/205 |
| 4,914,631 A * | 4/1990 | Johnson et al. | ............. | 365/205 |
| 4,924,442 A * | 5/1990 | Chen et al. | ................... | 365/205 |
| 5,245,578 A * | 9/1993 | McLaury | ..................... | 365/203 |
| 5,295,100 A * | 3/1994 | Starkweather et al. | ....... | 365/205 |
| 5,608,675 A * | 3/1997 | Nam | .......................... | 365/207 |
| 5,856,939 A * | 1/1999 | Seyyedy | ..................... | 365/205 |
| 5,889,718 A * | 3/1999 | Kitamoto et al. | ............ | 365/207 |
| 5,936,898 A * | 8/1999 | Chi | ............................. | 365/207 |
| 5,943,273 A * | 8/1999 | Hidaka et al. | ................ | 365/207 |
| 5,999,480 A * | 12/1999 | Ong et al. | .............. | 365/230.03 |
| 6,016,279 A * | 1/2000 | Chi | ............................. | 365/207 |
| 6,055,203 A | 4/2000 | Agarwal et al. | | |
| 6,061,278 A * | 5/2000 | Kato et al. | ................... | 365/207 |
| 6,445,636 B1 | 9/2002 | Keeth et al. | | |
| 6,466,499 B1 | 10/2002 | Blodgett | | |
| 6,515,913 B2 * | 2/2003 | Kajigaya et al. | ....... | 365/230.03 |
| 6,646,942 B2 | 11/2003 | Janzen | | |
| 6,654,297 B2 * | 11/2003 | Pinney | ....................... | 365/190 |
| 6,674,672 B2 * | 1/2004 | Forbes et al. | .......... | 365/189.09 |
| 6,678,186 B2 | 1/2004 | Mullarkey et al. | | |
| 6,724,663 B2 | 4/2004 | Roohparvar et al. | | |
| 6,728,152 B2 | 4/2004 | Van De Graaff | | |
| 6,795,361 B2 | 9/2004 | Joo | | |
| 6,795,364 B1 | 9/2004 | Leung et al. | | |
| 6,856,530 B2 * | 2/2005 | Kirsch | ......................... | 365/51 |
| 6,856,567 B2 | 2/2005 | Lee | | |
| 6,909,644 B2 * | 6/2005 | Fujioka et al. | .............. | 365/207 |
| 6,954,389 B2 * | 10/2005 | Nakamura | ................... | 365/207 |
| 7,164,595 B1 * | 1/2007 | Shore et al. | ................. | 365/207 |
| 7,257,015 B2 * | 8/2007 | Ohsawa et al. | .............. | 365/207 |

* cited by examiner

*Primary Examiner*—Trong Phan
(74) *Attorney, Agent, or Firm*—TraskBritt

(57) ABSTRACT

A system and method for erasing a block of data in a plurality of memory cells includes clamping one of a digit line and an I/O line in a sensing circuit of a memory device to a fixed logic level. The memory cells of the block of memory cells are selected and refreshed to the fixed logic level. A sense amplifier includes a clamping circuit adapted to connect one of a digit line and an I/O line to a fixed logic level in response to an erase signal during a refresh of the selected block of memory cells.

30 Claims, 6 Drawing Sheets

BLOCK ERASE FOR VOLATILE MEMORY

BACKGROUND OF THE INVENTION

1. Field of the Invention

The present invention relates to electronic memories and, more particularly, to memory devices and methods for performing an erase or preset of volatile memory elements.

2. State of the Art

Memory cells, and in particular dynamic random access memory (DRAM) cells, need to be refreshed from time-to-time to restore leaking charge and thus maintain a logic state therein. Conventionally, a DRAM refresh process is initiated by a processor or controller coupled to the memory device by supplying an appropriate control signal to a command or control interface of the memory device. More recently, DRAMs hide some forms of refresh from the processor.

In contrast to dynamic memory devices that require periodic refreshing of the memory cells, static memory devices that do not require refreshing of the memory cells have also become commonplace. However, static random access memory (SRAM) devices require more transistors and circuitry to maintain the stored charge. Because of the additional circuitry and the increased area associated therewith, design tradeoffs are frequently undertaken to determine an appropriate form of memory for a system. One developing form of a hybrid memory device has become known as a pseudo static random access memory (PSRAM) device. Accordingly, a PSRAM device includes desirable characteristics of both DRAM devices and SRAM devices, namely, the low cost and large capacity of a DRAM device with the simplified interface and integration of an SRAM device. The PSRAM device provides an improved memory cell density by employing higher density dynamic memory cells but also requires periodic refreshing in order to maintain the stored charge at levels sufficient to determine the logic state stored therein.

To accommodate these refresh requirements, PSRAM devices incorporate refresh circuitry which is "hidden" within the memory device and thus relieves the system designer of the burden of programming a controller or processor to periodically execute the refresh process. This hidden-refresh process within PSRAM devices must be periodically performed within the PSRAM device.

Data values stored in memory devices deteriorate over time if the quantity of charge stored therein is not timely refreshed. On a system power-up process, the data value stored in the memory device may be indeterminate. Therefore, there is a need to erase or set an initial value within the memory devices during initialization. Furthermore, the data values stored in memory devices may be highly confidential and desirably erased when the usefulness of the stored data values becomes obsolete. Accordingly, there is also a need to provide a method and system for efficiently erasing or setting groups of data values in a memory device.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
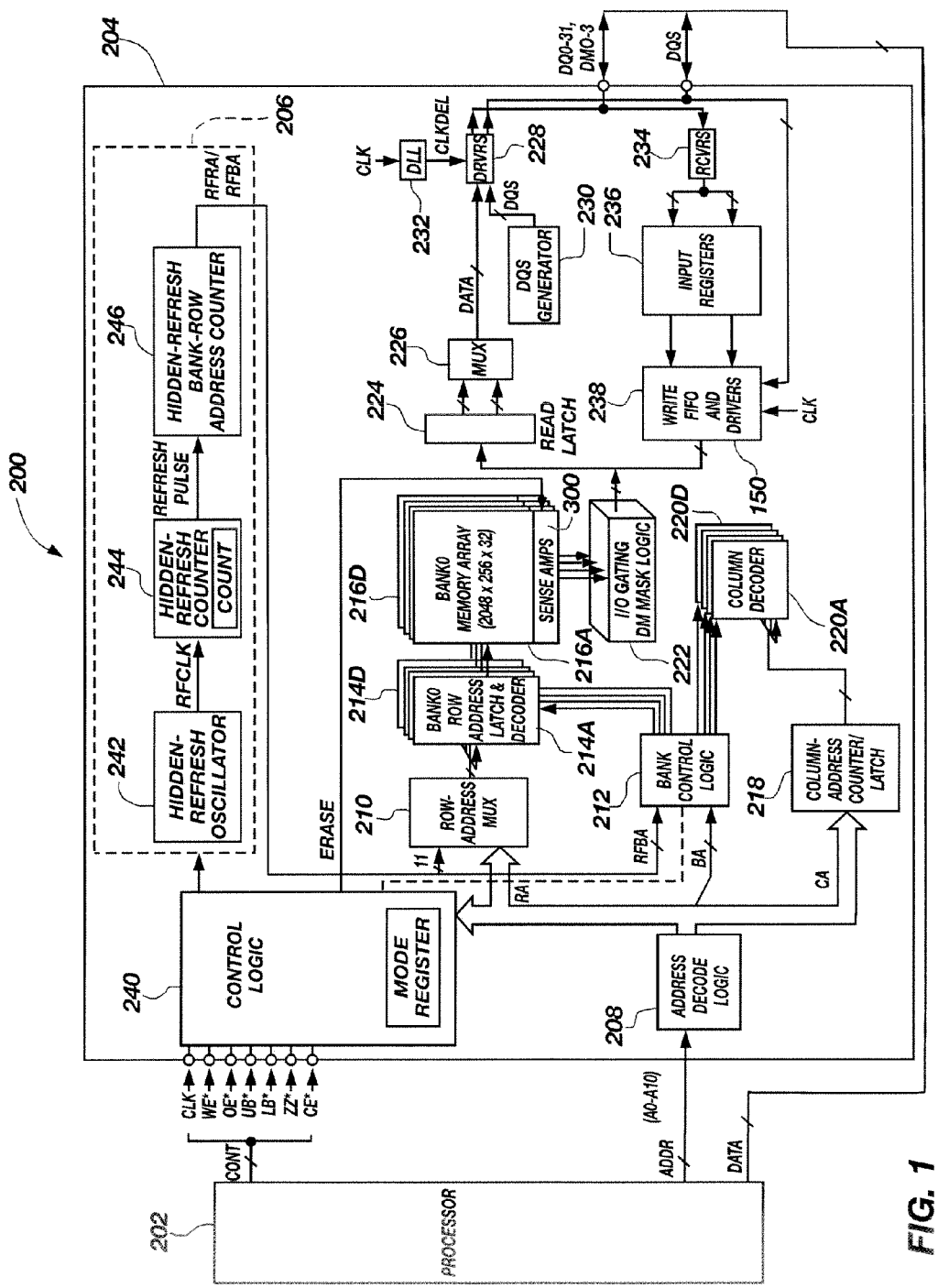
FIG. 1 is a functional block diagram of a system, including a processor and a memory device configured to erase data from a block of memory cells, in accordance with an embodiment of the present invention.

Referring in general to the following description and accompanying drawings, various aspects of the present invention are illustrated to show its structure and method of operation. Common elements of the illustrated embodiments are designated with like numerals. It should be understood the figures presented are not meant to be illustrative of actual views of any particular portion of the actual structure or method, but are merely idealized representations which are employed to more clearly and fully depict the present invention.

A system and method for erasing data in a plurality of memory cells in a memory device is provided. The method for erasing or setting data values includes clamping one of a digit line or an I/O line in a sensing circuit of a memory device to a fixed logic level. At least one memory cell is selected from a plurality of memory cells in the memory device and the selected memory devices are refreshed to the fixed logic level.

A sense amplifier for erasing or setting data includes a P-sense amplifier and an N-sense amplifier adapted to be connected between a pair of digit lines. The sense amplifier is configured for sensing a charge stored in a selected memory cell of a memory array and outputting a logic level corresponding to the charge on a pair of I/O lines. A clamping circuit is configured to connect one of the pair of digit lines or one of the pair of I/O lines to a fixed logic level in response to an erase signal during a refresh of the selected memory cell.

A memory device includes an array of dynamic memory cells and a plurality of sense amplifiers coupled to the array of dynamic memory cells. Each of the sense amplifiers includes a P-sense amplifier and an N-sense amplifier adapted to be connected between a pair of digit lines and for sensing charge stored in a selected memory cell of a memory array. The sense amplifier is further configured to output a logic level corresponding to the charge on a pair of I/O lines. A clamp circuit is configured to connect one of the pair of digit lines or one of the pair of I/O lines to a fixed logic level in response to an erase signal during a refresh of the selected memory cell. A semiconductor wafer including a plurality of memory devices as described herein is also provided.

An electronic system includes an input device, an output device, a memory device, and processor device operably coupled to the input, output, and memory devices. The memory device includes an array of dynamic memory cells and at least one sense amplifier. The sense amplifier includes a P-sense amplifier and an N-sense amplifier adapted to be connected between a pair of digit lines and for sensing charge stored in a selected memory cell of a memory array and outputting a logic level corresponding to the charge on a pair of I/O lines. The sense amplifier further includes a clamp circuit adapted to connect one of the pair of digit lines or one of the pair of I/O lines to a fixed logic level in response to an erase signal during a refresh of the selected memory cell.

FIG. 1 is a functional block diagram of a system 200 including a processor 202 coupled to a block erasable memory device 204. The block erasable memory device 204 includes a hidden-refresh controller 206 for performing refresh operations. In operation, the hidden-refresh controller 206 initiates a hidden-refresh operation upon the dynamic storage elements (e.g., dynamic memory cells) on a periodic basis. Block erasable memory device 204, when commanded by processor 202, is configured to perform a setting or resetting of one or more data values stored in the memory cells of the block erasable memory device 204. As used herein, the term "erase" includes both a setting of a data value or logic state in a memory cell to either a logic "one" or a logic "zero," or in the case of a memory system configured with additional logic states, the setting of a data value to any one of the possible logic states.

By way of example, and not limitation, the block erasable memory device 204 in FIG. 1 may be configured as a pseudo static random access memory (PSRAM) device configured as a dynamic random access memory (DRAM) device utilizing a hidden-refresh methodology. While one exemplary embodiment as described herein is drawn to a PSRAM device, the general principles described herein are applicable to any memory device containing memory cells that need charge replenishment through refreshing techniques (i.e., memory cells that store dynamic data including DRAMs, SDRAMs, SLDRAMs and RDRAMs). In the following description, certain details are set forth to provide a sufficient understanding of the various embodiments of the invention. Those of ordinary skill in the art will appreciate that the invention and its various embodiments may be practiced through the use of substitution of circuits and logic with programming methodologies coupled with program-executing circuitry. Additionally, the various embodiments of the present invention may be practiced without certain of the details as provided. Furthermore, well known circuits, control signals, timing protocols and other software operations are not shown herein in detail or have been entirely omitted in order to avoid unnecessarily obscuring elements of the various embodiments of the present invention.

System 200 includes a processor 202 which applies addresses to an address decode logic 208 over an address bus ADDR. Typically, the address decode logic 208 decodes a row address RA and a bank address BA which are applied to row address multiplexer 210 and bank control logic 212, respectively. The row address multiplexer 210 applies either the row address RA received from the address decode logic 208 or a refresh row address RFRA received from the hidden-refresh controller 206 to a plurality of row address latch and decoders 214A-D. The bank control logic 212 activates one of the row address latch and decoders 214A-D corresponding to either the received bank address BA or a refresh bank address RFBA from the hidden-refresh controller 206, and the activated row address latch and decoder circuit latches that decoded the received row address.

In response to the decoded row addresses, the activated row address latch and decoder 214A-D applies various control signals to a corresponding memory bank or memory array 216A-D to thereby activate a row of memory cells corresponding to the decoded row address. The data in the memory cells in the accessed row is sensed and stored in sense amplifiers 300 coupled to the memory bank or memory array 216A-D, which also refreshes the accessed memory cells as previously described. Similarly, during a refresh process, the row address multiplexer 210 applies the refresh row address RFRA to the row address latch and decoders 214A-D and the bank control logic 212 uses the refresh bank address RFBA when the block erasable memory device 204 performs a hidden-refresh of the memory cells within memory bank or memory array 216A-D.

As stated, address decode logic 208 decodes row and bank addresses RA, BA, and a column address CA from the address received on address bus ADDR. Address decode logic 208 may provide the column address CA to a column address counter and latch circuit 218 which, in turn, latches column address and applies the latch column address to a plurality of column decoders 220A-D. The bank control logic 212 activates the column decoder 220A-D corresponding to the received bank address BA, and the activated column decoder decodes the column address CA from the counter and latch circuit 218. Depending upon the operational mode of block erasable memory device 204, the counter and lath circuit 218 may either directly apply the latched column address to the column decoders 220A-D, or may apply a sequence of column addresses to the decoders starting at the column address CA provided by the address decode logic 208. In response to the column address CA from the counter and latch circuit 218, the activated column decoder 220A-D applies decode and control signals to an I/O gating and data masking circuit 222 which, in turn, accesses memory cells corresponding to the decoded column address in the activated row of memory cells in the memory array 216A-D being accessed.

Data being read during a read operation from the activated memory bank or array 216A-D may be coupled through the I/O gating and data masking circuit 222 to a read latch 224. The circuit 222 may supply N bits of data to the read latch 224, which may then apply two N/2 bit words to a multiplexer 226. A data driver circuit 228 sequentially receives the N/2 bit words from the multiplexer 226 and also receives a data strobe signal DQS from a strobe signal generator 230 and a delayed clock signal CLKDEL from a delayed-lock loop (DLL) circuit 232. The DQS signal has the same frequency as the CLK signal and is used by the processor 202 in latching data from the block erasable memory device 204 during read operations. In response to the delayed clock signal CLKDEL, the data driver circuit 228 sequentially outputs the received N/2 bit words as corresponding data words DQ that, in a dual data rate (DDR) configuration, are synchronized with the rising and falling edges of the CLK signal, and also outputs the data strobe signal DQS having rising and falling edges in synchronism with the rising and falling edges of the CLK signal. Each data word (e.g., DQ0-31) and the data strobe signal DQS collectively define a data bus DATA coupled to the processor 202 which, during read operations, latches each N/2 bit DQ word on the DATA bus responsive to the data strobe signal DQS.

The processor 202 during data write operations applies N/2 bit data words DQ, the strobe signal DQS on the data bus DATA. The data receiver circuit 234 receives each DQ word and applies these to an input register 236 that is clocked by the DQS signal. In a dual data rate (DDR) example and in response to the rising edge of the DQS signal, input register 236 latches a first N/2 bit DQ word and in response to a falling edge of the DQS signal, the input register-236 latches the corresponding N/2 bit DQ word. Input register 236 provides the two latched N/2 bit DQ words as an N-bit word to a write FIFO and driver circuit 238, which clocks the applied DQ word into the write FIFO and driver circuit 238 in response to the DQS signal. The DQS word is clocked out of the write FIFO and driver circuit 238 in response to the CLK signal, and then is applied to the I/O gating and masking circuit 222. The I/O gating and masking circuit 222 transfers the DQ word to the accessed memory cells in the active memory array 216A-D. While the present illustration is drawn to support a dual data rate, the various embodiments also contemplate lesser and greater data rates.

Control logic 240 receives a plurality of command and clocking signals from a processor 202 over a control bus CONT, and generates a plurality of control and timing signals to control the various memory device components 206-238 during operation of the block erasable memory device 204. The command signals may include a chip enable signal CE*, a write enable signal WE*, an output enable signal OE*, a lower byte enable signal LB*, an upper byte enable signal UB*, a clock signal CLK, and may optionally include other control signals such as a sleep enable signal ZZ*. One or more of the aforementioned signals may further include corresponding complementary signals, with the "*" designating a signal as being active when asserted low. When interfaced, processor 202 drives the command signals CE*, WE* to values corresponding to a particular command such as a read or write operation.

In response to the clock signal CLK, the control logic circuit 240 latches and decodes an applied command and generates a sequence of control signals that control various components in the memory device to execute the function of the applied command. By way of example, and not limitation, the control logic 240 latches command and address signals at positive edges of the CLK signal, while the input registers 236 and data driver circuits 228 may transfer data into and from the block erasable memory device 204 in response to either one or both edges of the data strobe signal DQS. When data transfer occurs on both edges of the clock signals CLK, block erasable memory device 204 may be referred to as a double-data-rate (DDR) device with data being transferred to and from the device at double the rate of a conventional SRAM, which transfers data at a rate corresponding to the frequency of the applied clock signal.

As previously stated, PSRAM memory devices generally find application to low-power portable applications while providing high density memory storage. Block erasable memory device 204 performs on-chip refresh operations, generally noted herein as a hidden-refresh of the dynamic memory cells within memory bank or memory array 216A-D. The hidden-refresh process performed by hidden-refresh controller 206 requires no additional support from a system memory controller. The hidden-refresh controller 206 detects the need for refreshing the data stored within the memory bank or memory array 216A-D to prevent the loss of the data logic states due to leakage currents associated with dynamic memory cells.

Generally, the hidden-refresh controller 206 includes a hidden-refresh oscillator 242 configured to generate a hidden-refresh clock signal RFCLK. The RFCLK signal provides a reference frequency for counting a quantity of clocks to determine a refresh interval or period. Hidden-refresh controller 206 further includes a hidden-refresh counter 244 coupled to the RFCLK signal of the hidden-refresh oscillator 242. Hidden-refresh counter 244 counts a specific quantity or COUNT of cycles of the RFCLK signal to determine when to assert a REFRESH PULSE signal. A refresh period or rate is determined for maintaining the stored charge within the memory bank or memory array 216A-D. The frequency of the REFRESH PULSE signal is a function of a defined threshold COUNT within the hidden-refresh counter 244. Hidden-refresh controller 206 further includes a hidden-refresh address counter 246 configured to generate refresh addresses (e.g., refresh row addresses RFRA and refresh bank addresses RFBA) in response to a REFRESH PULSE.

To place the block erasable memory device 204 in a hidden-refresh mode of operation, the hidden-refresh counter 244 detects achievement of a COUNT quantity of RFCLK signals which causes the commencement of a hidden-refresh operation. In response, the hidden-refresh controller 206 applies control signals to the row address multiplexer 210 and the bank control logic 212 which cause the circuits to utilize the refresh row address RFRA and refresh bank address RFBA from the hidden-refresh controller 206 to sequentially access each row of memory cells in the memory bank or array 216A-D and thereby refresh the memory cells. The hidden-refresh controller 206 controls the refresh of the memory cells in the memory bank or memory array 216A-D.

In operation, upon the generation of a REFRESH PULSE signal from the hidden-refresh counter 244, the hidden-refresh controller 206 applies control signals causing the row address multiplexer 210 and the bank control logic 212 to utilize the refreshed row address RFRA and refresh bank addresses RFBA, respectively. The hidden-refresh oscillator 242 may apply the refresh clock signal RFCLK to clock the hidden-refresh address counter 246 which in turn sequentially generates the refresh row addresses RFRA and refresh bank addresses RFBA. The sequentially generated refresh row addresses RFRA are applied through the multiplexer 210 and latched and decoded by one of the activated row address latch and decoders 214A-D, with the bank control logic circuit 212 activating the row address latch and decoders 214A-D corresponding to the refresh bank address RFBA. The hidden-refresh controller 206 generates a given refresh bank address RFBA and then generates refresh row addresses RFRA to sequentially activate all rows in the memory bank or memory array 216A-D corresponding to the bank address, and thereafter generates a new bank address and activates each row in the newly selected memory address, and so on for each memory arrays. In this manner, the refresh controller 206 sequentially activates rows of memory cells in the arrays 216A-D to thereby refresh the memory cells.

As stated, the block erasable memory device 204 is configured to perform an erase operation of one or more memory cells of memory bank or memory array 216A-D. When control logic 240 detects an erase command from processor 202, an ERASE signal is generated and routed to corresponding sense amplifiers 300. The erase command allows sections (e.g., blocks or pages) of memory cells within memory bank or memory array 216A-D to be erased or set to a known logic state.

The block erasable memory device 204 may be configured according to one or more embodiments of the present invention as illustrated with reference to FIGS. 2-5. Generally, the various embodiments include an embodiment of the present invention which enables the simultaneous erasure of multiple rows and/or multiple columns of the memory bank or memory array 216A-D while another embodiment of the present invention performs a sequential erasure of memory cells over a range of rows and/or columns of the memory bank or memory array 216A-D.

Figure 2:
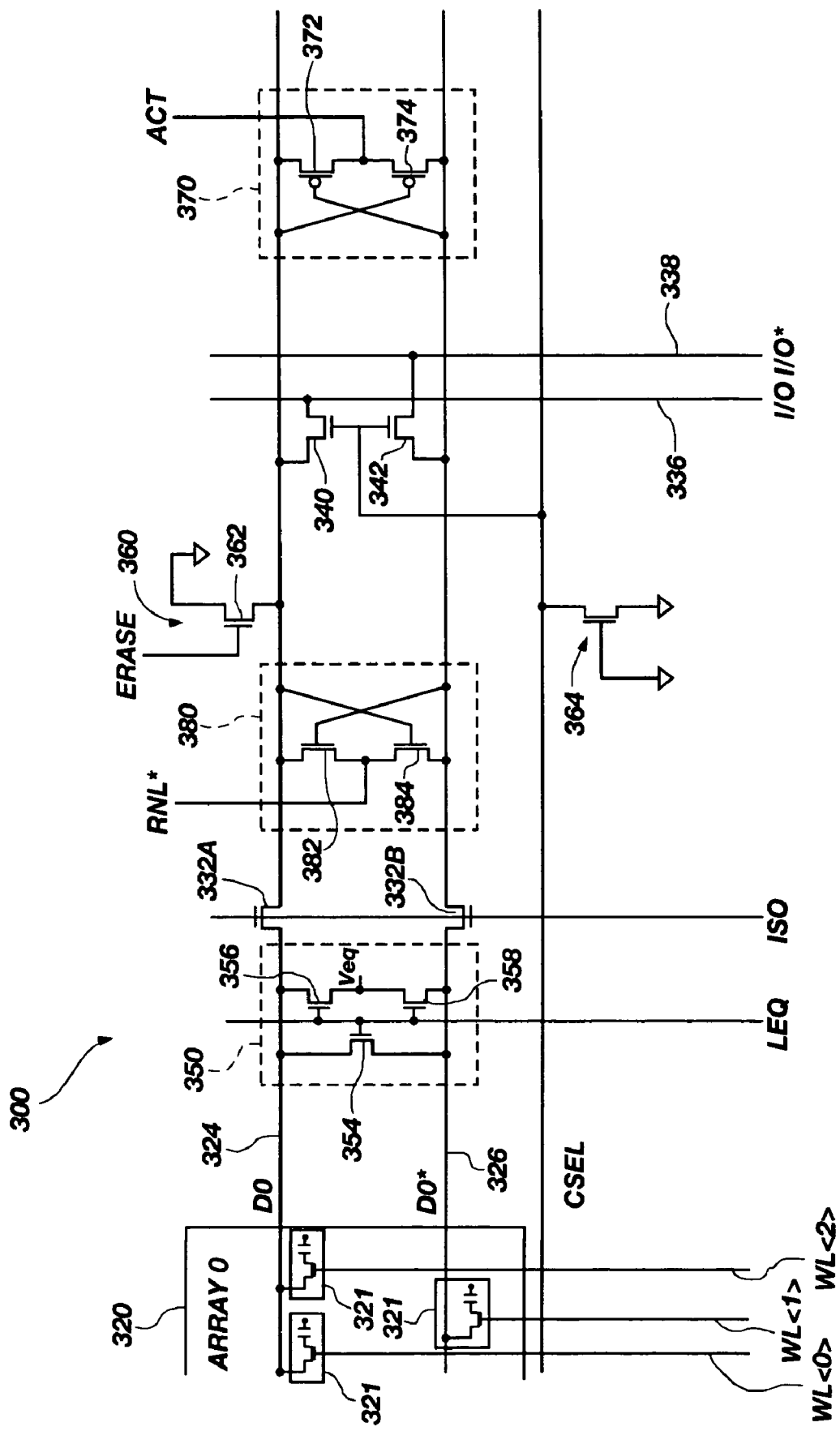
FIG. 2 illustrates a sense amplifier configured to erase data from one or more memory cells, in accordance with an embodiment of the present invention.

FIG. 2 illustrates a sense amplifier, in accordance with various embodiments of the present invention. As stated, DRAM devices include memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a first terminal of the capacitor and the gate terminal of the transistor is connected to a wordline of the memory device. The transistor thus acts as a gate between the digit line and the capacitor. A second terminal of the capacitor is connected to a voltage rail which carries a voltage, such as Vcc/2. Thus, when the wordline for a particular cell is active, the gate transistor is in a conducting state and the capacitor is connected to the digit line. The capacitor stores a charge that, depending on whether the capacitor is charged or discharged, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one (logic high) or a binary zero (logic low).

Memory devices are typically constructed with complementary digit lines of equal capacitance. Sense amplifiers are connected between the digit lines and operate to sense the differential voltage across the digit lines. Before a memory cell is selected for access, the complementary digit lines must be equilibrated. Equilibration circuits typically short the complementary digit lines together, resulting in an equilibrate voltage equal to the voltage midpoint between the two equal capacitance and logically opposite digit lines. Conventionally, a DRAM contains one sense amplifier for a designated group (row or column) of memory cells. If the voltage level stored in the memory cell represents a binary zero, one of the digit lines will increase in level, typically to a supply voltage Vcc, and the other digit line will decrease in level, typically to a ground level. If the voltage level stored in the selected memory cell corresponds to a binary one, a change in the opposite direction occurs. Through this complementary operation, the sense amplifier yields a single output signal which is coupled through an output buffer to an output pin of the DRAM device.

FIG. 2 illustrates a sensing circuit or a sense amplifier 300 of a block erasable memory device 204 (FIG. 1) having a first array ARRAY_0 320 which comprises a plurality of memory cells 321 selectable, for example, by various wordlines WL<0>-WL<2>. As is generally known in the art, the term sense amplifier includes a collection of circuit elements connected to the digit lines of a DR array. This collection typically includes isolation transistors, devices for equilibration and bias, one or more N-sense amplifiers, one or more P-sense amplifiers, and devices connecting selected digit lines to input/output signal lines as will be described below.

As shown in FIG. 2, sense amplifier 300 includes a P-sense amplifier 370 and an N-sense amplifier 380 for sensing charge stored in the selected memory cell of the selected array 320 via a voltage differential on the pair of digit lines DO 324 and DO* 326. One of the arrays 320 is selected by application of ISO signal to transistors 332A and 332B. Thus, when ISO signal is driven to a logic high value, transistors 332A and 332B become conductive, i.e., turn on, to connect ARRAY_0 320 to P-sense amplifier 370 and N-sense amplifier 380. When ISO signal is driven to a logic low value, and transistors 332A and 332B turn off to isolate ARRAY_0 320 from P-sense amplifier 380 and N-sense amplifier 370.

Equilibration circuit 350 is provided to equilibrate the digit lines DO 324 and DO* 326. Equilibration circuit 350 includes transistor 354 with a first source/drain region coupled to digit line DO 324, a second source/drain region coupled to digit line DO* 326 and a gate coupled to receive an equilibration signal LEQ. Equilibration circuit 350 further includes first and second transistors 356 and 358. Transistor 356 includes a first source/drain region that is coupled to digit line DO 324, a gate that is coupled to receive the equilibration signal LEQ and a second source/drain region that is coupled to receive an equilibration voltage Veq, which, as noted, is typically equal to Vcc/2. Second transistor 358 includes a first source/drain region that is coupled to digit line DO* 326, a gate that is coupled to receive the equilibration signal LEQ and a second source/drain region that is coupled to the equilibration voltage Veq. When the signal LEQ is at a high logic level, equilibration circuit 350 effectively shorts digit line DO 324 to digit line DO* 326 such that both lines are equilibrated to the voltage Veq.

When P-sense amplifier 370 and N-sense amplifier 380 have sensed the differential voltage across the digit lines DO 324 and DO* 326 (as described below), a signal representing the charge stored in the accessed memory cell is output from the DRAM device on the input/output (I/O) lines I/O 336 and I/O* 338 by connecting the I/O lines I/O 336 and I/O* 338 to the digit lines DO 324 and DO* 326, respectively. A column select (CSEL) signal is applied to transistors 340, 342 to turn them on and connect the digit lines DO 324 and DO* 326 to the I/O lines I/O 336 and I/O* 338.

The operation of the P-sense amplifier 370 and N-sense amplifier 380 is as follows. These amplifiers work together to detect the access signal voltage and drive the digit lines DO 324 and DO* 326 to Vcc and ground accordingly. As shown in FIG. 2, the N-sense amplifier 380 consists of cross-coupled NMOS transistors 382, 384 and drives the low potential digit line to ground. Similarly, the P-sense amplifier 370 consists of cross-coupled PMOS transistors 372, 374 and drives the high potential digit line to Vcc. The NMOS pair of transistors 382, 384 or N-sense-amplifier common node is labeled RNL*. Similarly, the P-sense-amplifier 370 common node is labeled ACT (for ACTive pull-up). Initially, RNL* is biased to Vcc/2 and ACT is biased to ground. Since the digit line pair DO 324 and DO* 326 are both initially at Vcc/2 volts, the N-sense-amplifier transistors 382, 384 remain off due to zero Vgs potential. Similarly, both P-sense-amplifier transistors 372, 374 remain off due to their negative Vgs potential. As discussed, a signal voltage develops between the digit line pair DO 324, DO* 326 when the memory cell access occurs.

While one digit line contains charge from the memory cell access, the other digit line serves as a reference for the sensing operation. The sense amplifier firing generally occurs sequentially rather than concurrently. The N-sense-amplifier 380 fires first and the P-sense-amplifier 370 fires second or subsequent to the N-sense-amplifier 380. Pulling the RNL* signal toward ground activates or "fires" the N-sense-amplifier 380. As the voltage between RNL* and the digit lines approaches the transistor threshold voltage $V_t$, the NMOS transistor whose gate connection is to the higher voltage digit line will begin to conduct. Conduction results in the discharge of the low voltage digit line toward the RNL* voltage. Ultimately, RNL* will reach ground, bringing the digit line with it. Note that the other NMOS transistor will not conduct since its gate voltage derives from the low voltage digit line, which is discharging toward ground.

Shortly after the N-sense-amplifier 380 fires, ACT will be driven toward Vcc. This activates the P-sense-amplifier 370 that operates in a complementary fashion to the N-sense-amplifier 380. With the low voltage digit line approaching ground, a strong signal exists to drive the appropriate PMOS transistor into conduction. This will charge the high voltage digit line toward ACT, ultimately reaching Vcc. Since the pass transistor (e.g., memory bit transistor) of the memory cell 321 remains on during sensing, the memory bit capacitor will charge to the RNL* or ACT voltage level. The voltage, and hence charge, which the memory bit capacitor held prior to accessing will restore a full level, i.e., Vcc for a logic one and GND for a logic zero.

While data resident in DRAM memory cells, whether purposefully stored or passively appearing, such as during a power-up process, may simply be replaced by writing over the existing data, there is a need to either initialize a block of memory cells to a known state or to erase data stored in a block of memory cells. While a block of memory cells in a memory device 200 (FIG. 1) could simply be initialized or erased through sequential accesses by processor 202 (FIG. 1), there is a need to provide an efficient means for localizing a block erase process within the memory device without taxing an external host device such as processor 202 (FIG. 1) during the entire block erase process.

Accordingly, the sense amplifier 300 of FIG. 2 further includes a clamping circuit 360 coupled to at least one of the pair of digit lines DO 324 and DO* 326. The clamping circuit 360 clamps or forces at least one of the pair of digit lines DO 324 and DO* 326 to a known signal level, such as to a logic high level consistent with Vcc or a logic low level consistent with ground or Vss, regardless of the logic level of the data that is contained within the memory bit capacitor of the memory cell. Accordingly, the clamping circuit 360 dissipates or overrides the electrical charge stored in the memory bit capacitor to effectively resave the voltage as clamped to the at least one of the pair of digit lines DO 324 and DO* 326 back to the memory bit capacitor of the memory cell following the accessing of the memory cell.

By way of example and not limitation, the clamping circuit 360 is illustrated as an NMOS transistor 362 and includes a first source/drain region that is coupled to at least one of the pair of digit lines DO 324, DO* 326, a gate that is coupled to receive the ERASE signal and a second source/drain region that is coupled to a reference signal Vss or GND potential. While clamping circuit 360 is illustrated in one embodiment of the present invention as including NMOS transistor 362, a PMOS transistor (not shown) could also be used in another embodiment of the present invention to electrically couple a reference signal Vcc or source potential when gated or controlled by the ERASE signal. Those of ordinary skill in the art appreciate that for many common fabrication processes, utilizing an NMOS transistor 362 instead of a PMOS transistor results in a faster switching time for the clamping circuit 360.

If the clamping circuit 360 is coupled to only one of the pair of digit lines DO 324, DO* 326, a further embodiment of the present invention includes a load matching circuit 364 coupled to the other one of the pair of digit lines DO 324, DO* 326. Load matching circuit 364 provides symmetrical electrical loading of the pair of digit lines DO 324, DO* 326 for balanced performance during conventional sensing operations by the sense amplifier 300. Symmetrical electrical load matching is generally accomplished by using similarly sized and fabricated transistors for both the clamping circuit 360 and the load matching circuit 364.

Figure 3:
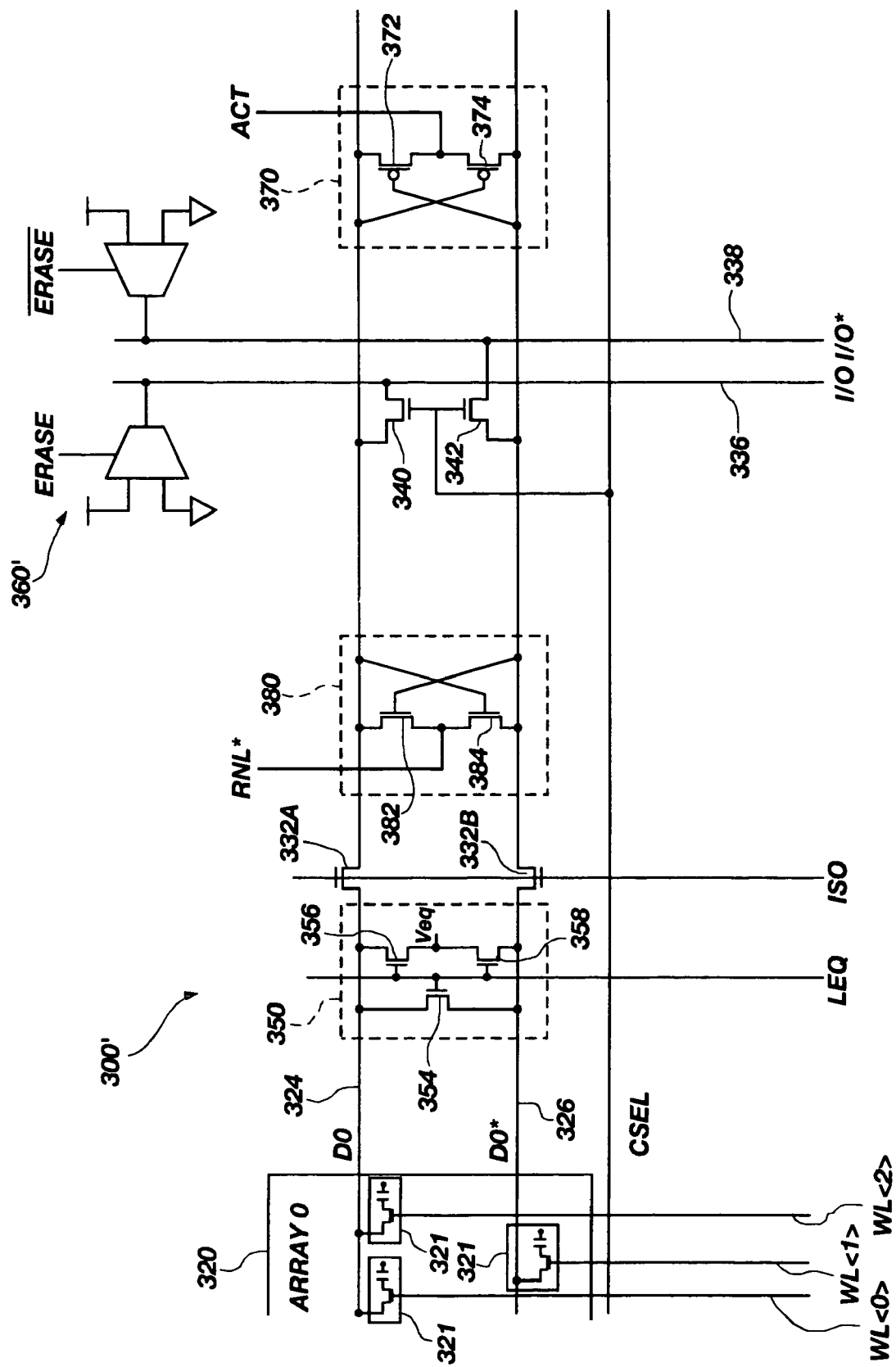
FIG. 3 illustrates a sense amplifier configured to erase data from one or more memory cells, in accordance with another embodiment of the present invention.

FIG. 3 illustrates a sensing circuit or a sense amplifier 300' of a block erasable memory device 204 (FIG. 1), in accordance with another embodiment of the present invention. The present embodiment is generally configured according to the embodiment of FIG. 2, however, the present embodiment includes a clamping circuit 360' configured to generate a fixed logic level to the I/O lines I/O 336, I/O* 338 in response to the assertion of the ERASE and ERASE* signals. The present embodiment facilitates the block erasure of memory cells by asserting multiple CSEL lines, either concurrently or sequentially, causing the fixed logic level generated by clamping circuit 360' to be saved back into the memory cells during a refresh operation.

As stated, the present embodiment includes a first array ARRAY_0 320, a plurality of memory cells 321 selectable, for example, by various wordlines WL<0>-WL<2>, sense amplifier 300 including a P-sense amplifier 370, N-sense amplifier 380, a pair of digit lines DO 324 and DO* 326, transistors 332A and 332B, an equilibration circuit 350, and digit lines DO 324 and DO* 326 configured as described hereinabove with reference to FIG. 2.

Accordingly, the sense amplifier 300' of FIG. 3 further includes a clamping circuit 360' coupled to at least one of the pair of lines I/O 336 and I/O* 338. The clamping circuit 360' clamps or forces at least one of the pair of lines I/O 336 and I/O* 338 to a known signal level, such as to a logic high level consistent with Vcc or a logic low level consistent with ground or Vss, regardless of the logic level of the data that is contained within the memory bit capacitor of the memory cell. Accordingly, the clamping circuit 360' dissipates or overrides the electrical charge stored in the memory bit capacitor to effectively resave the voltage as clamped to the at least one of the pair of lines I/O 336 and I/O* 338 back to the memory bit capacitor of the memory cell following the accessing of the memory cell.

Figure 4:
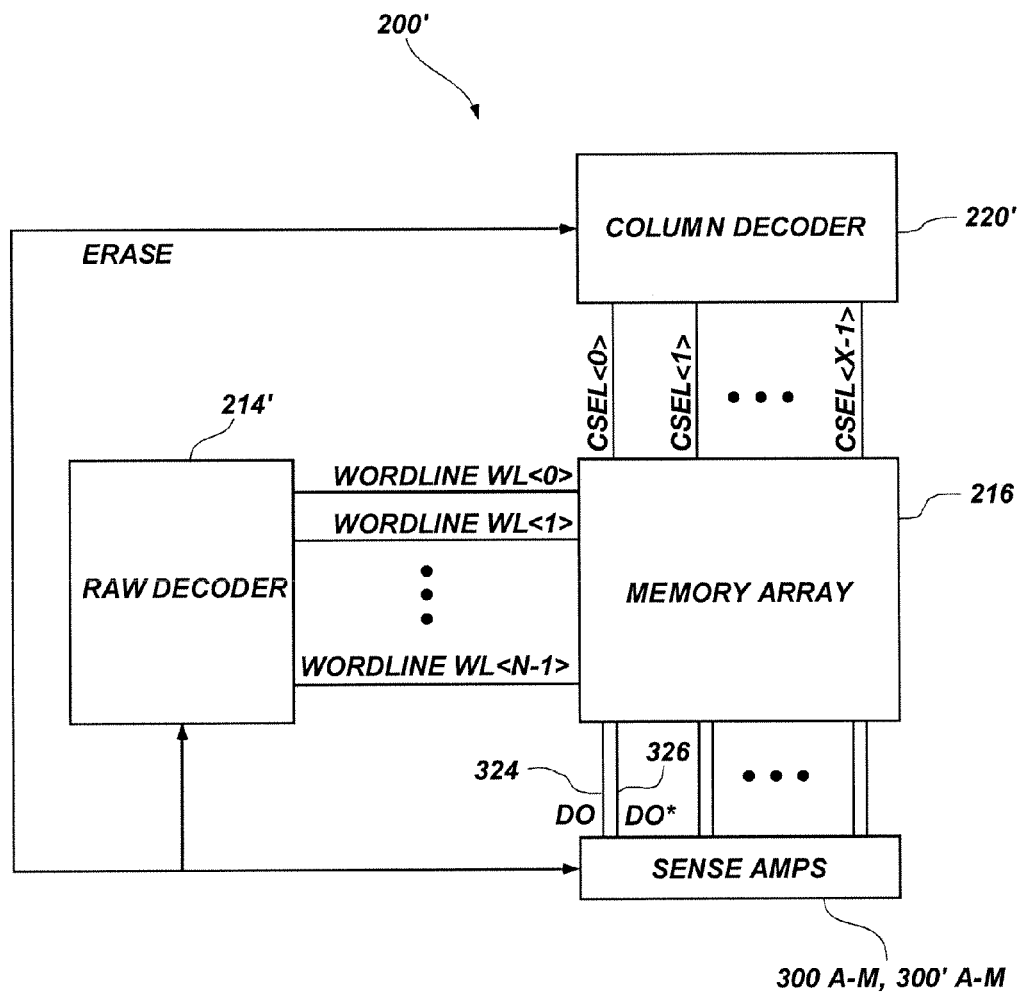
FIG. 4 illustrates portions of a memory device configured to concurrently erase a plurality of memory cells, in accordance with an embodiment of the present invention.

As stated, a block of memory cells may be erased in either concurrent or sequential process. FIG. 4 illustrates a portion of the system 200 (FIG. 1), referred to in the present embodiment as memory device 200', configured to simultaneously erase a plurality of memory cells in a block of memory cells, in accordance with one embodiment of the present invention. The ERASE signal is generated by the control logic 240 (FIG. 1) in response to a command received from processor 202 (FIG. 1). A plurality of memory cells may be simultaneously erased either by the simultaneous selection of multiple wordlines WL<0>-WL<N−1> or by the simultaneous selection of multiple column select lines CSEL<0>-CSEL<X−1>. Additionally, multiple wordlines WL and multiple column select CSEL lines may be simultaneously selected to provide a selection of a two-dimensional group of memory cells for simultaneous erasing of a group of memory cells.

The ERASE signal couples to one or more sense amplifiers 300A-M as described with reference to FIG. 2. The ERASE signal activates the clamping circuit 360 (FIG. 2) of the respectively selected sense amplifiers 300A-M. In one embodiment of the present invention, multiple memory cells are simultaneously erased by the simultaneous assertion of multiple wordlines as generated in response to the ERASE signal coupling to row decoder 214'. During normal memory cell reading and writing operations, the ERASE signal is not asserted and the row decoder 214' individually selects a single wordline. However, when a block erase process is commanded from processor 202 (FIG. 1), the control logic 240 (FIG. 1) decodes the block erase command and causes the row decoder 214' to assert the requested plurality of wordlines WL<0>-WL<N−1>.

In the present embodiment, the simultaneous assertion of multiple wordlines WL<0>-WL<N−1> connects multiple memory cells to a shared pair of digit lines DO 324, DO* 326 including a corresponding clamping circuit 360 (FIG. 2). The clamping circuit 360 must source (PMOS transistor configured clamping circuit) or sink (NMOS transistor configured clamping circuit) electrical charge for multiple memory cells. Accordingly, additional clock cycles for the simultaneous block erase process in the memory device 200' are required over a conventional single wordline write process in order to source/sink the requisite electrical current for the simultaneously activated plurality of memory cells.

As stated, multiple column select CSEL signals may alternatively be asserted to simultaneously erase multiple memory cells, in accordance with another embodiment of the present invention. In the present embodiment, the ERASE signal couples to one or more sense amplifiers 300'A-M as described with reference to FIG. 3. The ERASE signal activates the clamping circuit 360' (FIG. 3) of the respectively selected sense amplifiers 300'A-M and multiple memory cells are simultaneously erased by the simultaneous assertion of multiple column select CSEL signals as generated in response to the ERASE signal coupling to column decoder 220'. During normal memory cell reading and writing operations, the ERASE signal is not asserted and the column decoder 220' individually selects one or more columns, however, when a block erase process is commanded from processor 202 (FIG. 1), the control logic 240 (FIG. 1) decodes the block erase command and causes the column decoder 220' to assert the requested ones of column select CSEL signals CSEL<0>-CSEL<X–1>.

In the present embodiment, the simultaneous assertion of multiple column select CSEL<0>-CSEL<X–1> signals connects at least one memory cell to a shared pair of digit lines DO 324, DO* 326 including a clamping circuit 360' (FIG. 3) for each column select CSEL signal asserted. If only one memory cell is coupled to each sense amplifier 300'A-M, then the dedicated clamping circuit 360' for each sense amplifier 300'A-M does not significantly extend the erase process time from a normal memory cell write when only a single memory cell is coupled to each sense amplifier 300'A-M.

In yet another embodiment of the present invention, multiple wordlines WL<0>-WL<N–1> and multiple column select CSEL<0>-CSEL<X–1> signals may be simultaneously asserted by row decoder 214' and column decoder 220' resulting in the simultaneous activation of a two dimensional array of memory cells. Accordingly, the simultaneous assertion of multiple wordlines WL<0>-WL<N–1> connects multiple memory cells to a shared pair of digit lines DO 324, DO* 326 including a clamping circuit 360 (FIG. 2). Additionally, the simultaneous assertion of multiple column select CSEL<0>-CSEL<X–1> signals results in the assertion of a corresponding number of clamping circuits 360 of the asserted sense amplifiers 300A-M. Loading of shared pair of digit lines DO 324, DO* 326 and the clamping circuit 360 with a plurality of memory cells requires additional clock cycles for the block erase process in the memory device 200' in order to source/sink the requisite electrical current for the simultaneously activated plurality of memory cells that share a pair of digit lines DO 324, DO* 326.

Figure 5:
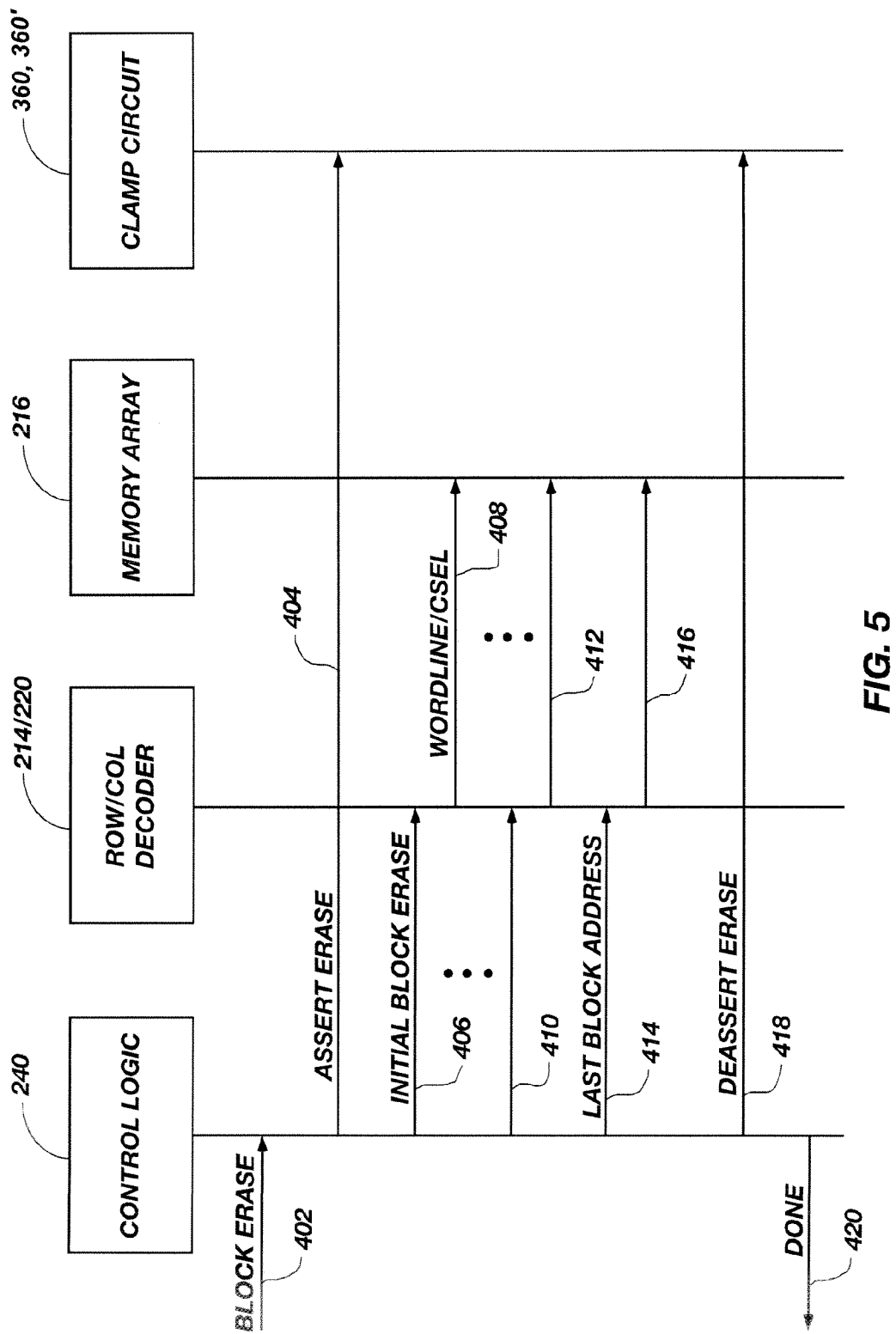
FIG. 5 illustrates a flow diagram of a memory device configured to sequentially erase data from a plurality of memory cells, in accordance with another embodiment of the present invention.

While various embodiments for simultaneously erasing multiple memory cells have been described with respect to FIG. 4, an additional embodiment for sequentially erasing a block of memory cells is described herein with respect to FIG. 5. FIG. 5 illustrates sequentially erasing a block of memory cells, in accordance with yet another embodiment of the present invention. Control logic 240 receives a BLOCK ERASE 402 command from processor 202 (FIG. 1) and asserts 404 the ERASE signal to clamping circuit 360, 360'. Control logic 240 generates 406 a beginning point or initial block address to row/column decoder 214/220 which in turn generates 408 corresponding wordlines/column select signals to memory array 216. The sense amplifiers 300 (FIG. 2), 300' (FIG. 3) are readied for sensing according to the processes as described herein above and complete the sensing process as clamped by clamping circuit 360, 360' following each of the decoding operations.

The control logic 240 continues to sequence to subsequent addresses corresponding to other portions of the block by receiving 410, 414 block addresses and generating 412, 416 corresponding wordlines/column select signals to memory array 216. When the entire block has been traversed through addressing and sensing, the ERASE signal is deasserted 418 and the sequential erasing of the block of the memory array is completed and asserts a DONE 420 signal.

Figure 6:
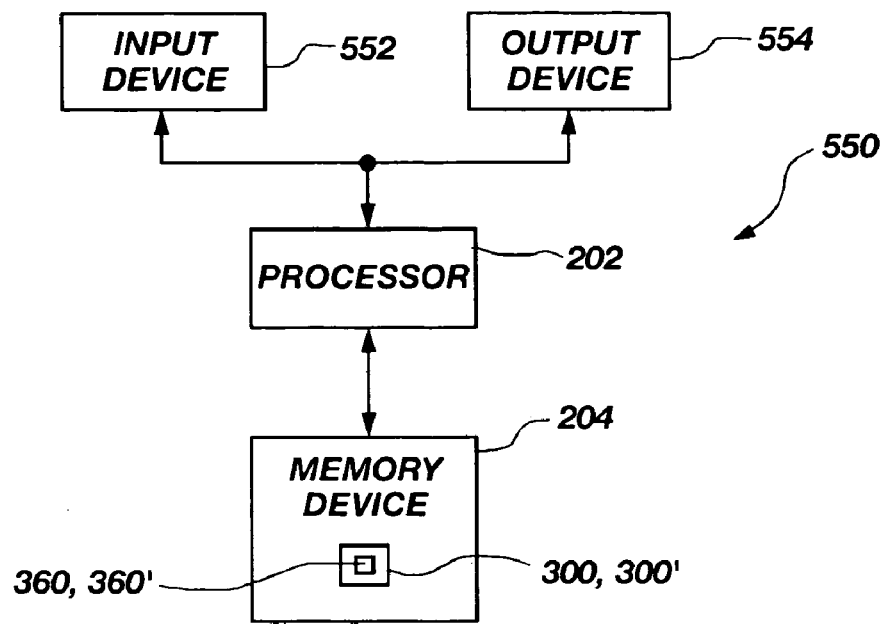
FIG. 6 is a block diagram of an electronic system including a block erasable memory device configured with the memory cell erasing functionality described herein, in accordance with yet another embodiment of the present invention.

FIG. 6 is a block diagram of an electronic system including a block erasable memory device configured in accordance with an embodiment of the present invention. An electronic system 550 includes an input device 552, an output device 554, a processor 202, and a block erasable memory device 204 incorporating a sense amplifier 300, 300' further including a clamping circuit 360, 360', as described above with reference to FIGS. 1-5.

Figure 7:
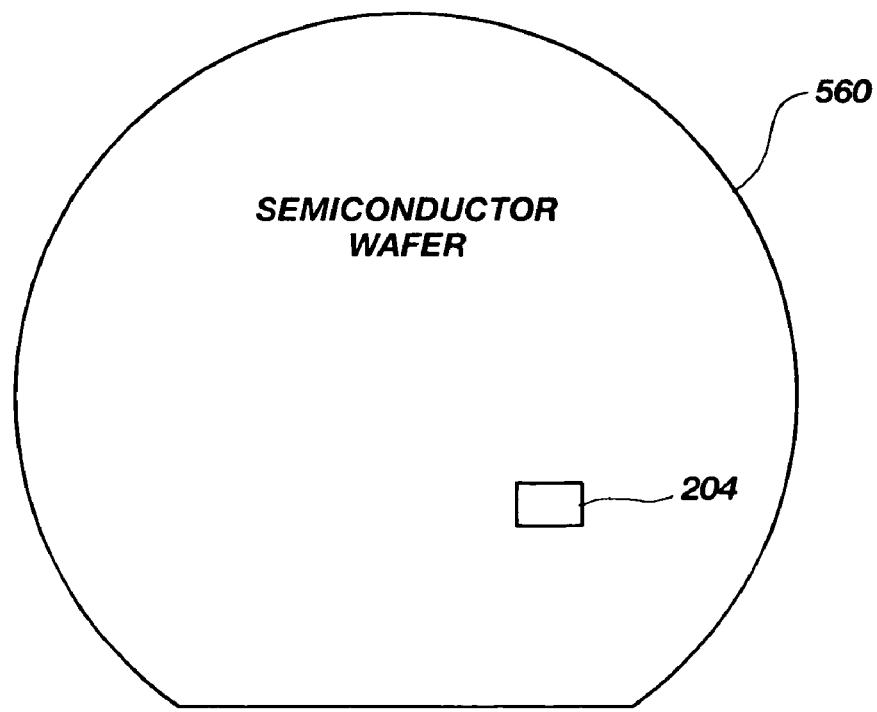
FIG. 7 is a diagram of a semiconductor wafer including a block erasable memory device configured with the memory cell erasing functionality described herein, in accordance with yet a further embodiment of the present invention.

As shown in FIG. 7, the block erasable memory device 204 of FIGS. 1-5 may be fabricated on a semiconductor wafer 560. Of course, it should be understood that semiconductor substrates other than a semiconductor wafer also fall within the scope of the present invention, including, for example, Silicon-On-Sapphire (SOS) substrates and Silicon-On-Glass (SOG) substrates.

Although the present invention has been described with reference to particular embodiments, the invention is not limited to these described embodiments. Rather, the invention is limited only by the appended claims, which include within their scope all equivalent devices or methods that operate according to the principles of the inventions as described.

The invention claimed is:

1. A method for erasing data in a plurality of memory cells in a memory device, comprising:
   clamping one of a digit line and an I/O line in a sensing circuit of a memory device to a fixed logic level of one of a logic high signal or a logic low signal in response to an erase signal;
   selecting at least one memory cell from a plurality of memory cells in the memory device; and
   refreshing each of the at least one memory cell to the fixed logic level.

2. The method of claim 1, further comprising load balancing one of a respectively complementary digit line and complementary I/O line of the digit line and the I/O line in the sensing circuit.

3. The method of claim 1, wherein selecting at least one memory cell includes concurrently selecting each of the at least one memory cell and wherein refreshing further includes concurrently refreshing each of the at least one memory cell.

4. The method of claim 3, wherein the digit line is clamped to the fixed logic level and further includes concurrently selecting each of the at least one memory cell by concurrently selecting a plurality of wordlines coupling each of the at least one memory cell to the digit line.

5. The method of claim 3, wherein the I/O line is clamped to the fixed logic level and further includes concurrently selecting each of the at least one memory cell by concurrently selecting a plurality of column select lines coupling each of the at least one memory cell to the I/O line.

6. The method of claim 1, wherein selecting at least one memory cell includes sequentially selecting each of the at least one memory cell and wherein refreshing further includes sequentially refreshing each of the at least one memory cell.

7. The method of claim 6, wherein the digit line is clamped to the fixed logic level and further includes sequentially selecting each of the at least one memory cell by sequentially selecting a plurality of wordlines coupling each of the at least one memory cell to the digit line.

8. The method of claim 6, wherein the I/O line is clamped to the fixed logic level and further includes sequentially selecting each of the at least one memory cell by sequentially selecting a plurality of column select lines coupling each of the at least one memory cell to the I/O line.

9. The method of claim 1, further comprising refreshing each of the plurality of memory cells according to a hidden refresh rate of the memory device.

10. A method for setting data in a plurality of memory cells in a memory device to a fixed logic level, comprising:
   receiving a control signal at the memory device identifying a block erase of a block of the plurality of memory cells;
   clamping to a fixed logic level one of a digit line and an I/O line in each of at least one sensing circuit corresponding to the block in response to an erase signal; wherein the fixed logic level is one of a logic high signal or a logic low signal; and
   refreshing the block of the plurality of memory cells to the fixed logic level.

11. The method of claim 10, wherein refreshing the block includes concurrently refreshing each of the plurality of memory cells of the block.

12. The method of claim 11, wherein clamping includes clamping the digit line to the fixed logic level and further includes concurrently selecting each of the plurality of memory cells of the block by concurrently selecting a plurality of wordlines coupling each of the plurality of memory cells of the block to the digit line.

13. The method of claim 11, wherein clamping includes clamping the I/O line to the fixed logic level and further includes concurrently selecting each of the plurality of memory cells of the block by concurrently selecting a plurality of column select lines coupling each of the plurality of memory cells of the block to the I/O line.

14. The method of claim 10, wherein refreshing the block includes sequentially refreshing each of the plurality of memory cells of the block.

15. The method of claim 14, wherein clamping includes clamping the digit line to the fixed logic level and further includes sequentially selecting each of the plurality of memory cells of the block by sequentially selecting a plurality of wordlines coupling each of the plurality of memory cells of the block to the digit line.

16. The method of claim 14, wherein clamping includes clamping the I/O line to the fixed logic level and further includes sequentially selecting each of the plurality of memory cells of the block by sequentially selecting a plurality of column select lines coupling each of the plurality of memory cells of the block to the I/O line.

17. A sense amplifier, comprising:
   a P-sense amplifier and an N-sense amplifier adapted to be connected between a pair of digit lines and for sensing a charge stored in a selected memory cell of a memory array and outputting a logic level corresponding to the charge on a pair of I/O lines; and
   a clamp circuit adapted to connect one of the pair of digit lines or one of the pair of I/O lines to a fixed logic level of one of a logic high signal or a logic low signal in response to an erase signal during a refresh of the selected memory cell.

18. The sense amplifier of claim 17, further comprising a load matching circuit adapted to connect to a respectively complementary one of the pair of digit lines or the pair of I/O lines, the load matching circuit and the clamping circuit having a substantially equal electrical loading effect on each of the pair of digit lines or the pair of I/O lines.

19. A memory device, comprising:
   an array of dynamic memory cells; and
   a plurality of sense amplifiers coupled to the array of dynamic memory cells, each of the sense amplifiers including:
      a P-sense amplifier and an N-sense amplifier adapted to be connected between a pair of digit lines and for sensing charge stored in a selected memory cell of a memory array and outputting a logic level corresponding to the charge on a pair of I/O lines; and
      a clamp circuit adapted to connect one of the pair of digit lines or one of the pair of I/O lines to a fixed logic level of one of a logic high signal or a logic low signal in response to an erase signal during a refresh of the selected memory cell.

20. The memory device of claim 19, further comprising a hidden-refresh controller configured to refresh data in the dynamic memory cells.

21. The memory device of claim 19, further including control logic configured to receive a control signal identifying a block erase of a block of a plurality of dynamic memory cells in the array of memory cells and further configured to control the clamp circuit and refresh the block of the plurality of memory cells to the fixed logic level.

22. The memory device of claim 21, wherein the control logic is further configured to concurrently refresh each of the plurality of memory cells of the block to the fixed logic level.

23. The memory device of claim 22, wherein when the clamp circuit is connected to one of the pair of digit lines, the control logic is further configured to concurrently select each of the plurality of memory cells of the block by concurrently selecting a plurality of wordlines coupling each of the plurality of memory cells of the block to one of the pair of digit lines.

24. The memory device of claim 22, wherein when the clamp circuit is connected to one of the pair of I/O lines, the control logic is further configured to concurrently select each of the plurality of memory cells of the block by concurrently selecting a plurality of column select lines coupling each of the plurality of memory cells of the block to one of the pair of I/O lines.

25. The memory device of claim 21, wherein the control logic is further configured to sequentially refresh each of the plurality of memory cells of the block to the fixed logic levels.

26. The memory device of claim 25, wherein when the clamp circuit is connected to one of the pair of digit lines, the control logic is further configured to sequentially select each of the plurality of memory cells of the block by sequentially selecting a plurality of wordlines coupling each of the plurality of memory cells of the block to the digit line.

27. The memory device of claim 25, wherein when the clamp circuit is connected to one of the pair of I/O lines, the control logic is further configured to sequentially select each of the plurality of memory cells of the block by sequentially selecting a plurality of column select lines coupling each of the plurality of memory cells of the block to one of the pair of I/O lines.

28. An electronic system comprising an input device, an output device, a memory device, and processor device operably coupled to the input, output, and memory devices, the memory device including an array of dynamic memory cells and at least one sense amplifier, comprising:
   a P-sense amplifier and an N-sense amplifier adapted to be connected between a pair of digit lines and for sensing charge stored in a selected memory cell of a memory array and outputting a logic level corresponding to the charge on a pair of I/O lines; and a clamp circuit adapted to connect one of the pair of digit lines or one of the pair of I/O lines to a fixed logic level of one of a logic high signal or a logic low signal in response to an erase signal during a refresh of the selected memory cell.

29. The electronic system of claim 28, wherein the memory device further includes a hidden-refresh controller configured to refresh data in the dynamic memory cells.

30. A semiconductor wafer including a plurality of memory devices, at least one of the plurality of memory devices, comprising:

an array of dynamic memory cells; and a sense amplifier, comprising:

a P-sense amplifier and an N-sense amplifier adapted to be connected between a pair of digit lines and for sensing charge stored in a selected memory cell of a memory array and outputting a logic level corresponding to the charge on a pair of I/O lines; and a clamp circuit adapted to connect one of the pair of digit lines or one of the pair of I/O lines to a fixed logic level of one of a logic high signal or a logic low signal in response to an erase signal during a refresh of the selected memory cell.

* * * * *